(12) United States Patent
Imai et al.

(10) Patent No.: US 10,170,400 B2
(45) Date of Patent: Jan. 1, 2019

(54) MULTI-FINGER TRANSISTOR AND SEMICONDUCTOR DEVICE

(71) Applicant: Mitsubishi Electric Corporation, Tokyo (JP)

(72) Inventors: Shohei Imai, Tokyo (JP); Eigo Kuwata, Tokyo (JP); Koji Yamanaka, Tokyo (JP); Hiroaki Maehara, Tokyo (JP); Akira Ohta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/526,578

(22) PCT Filed: Jul. 21, 2015

(86) PCT No.: PCT/JP2015/070686
§ 371 (c)(1),
(2) Date: May 12, 2017

(87) PCT Pub. No.: WO2016/098374
PCT Pub. Date: Jun. 23, 2016

(65) Prior Publication Data
US 2017/0317012 A1    Nov. 2, 2017

(30) Foreign Application Priority Data
Dec. 16, 2014   (JP) ................. 2014-254176

(51) Int. Cl.
*H01L 23/482*  (2006.01)
*H01L 21/822*  (2006.01)
(Continued)

(52) U.S. Cl.
CPC ........ *H01L 23/4824* (2013.01); *H01L 21/822* (2013.01); *H01L 23/4821* (2013.01);
(Continued)

(58) Field of Classification Search
CPC ............... H01L 21/822; H01L 23/4821; H01L 23/4824; H01L 27/04; H01L 27/0727;
(Continued)

(56) References Cited

U.S. PATENT DOCUMENTS 5,883,407 A    3/1999   Kunii et al.
6,424,006 B1   7/2002   Ponse
(Continued)

FOREIGN PATENT DOCUMENTS

JP    H07-226488 A    8/1995
JP    H09-008064 A    1/1997
(Continued)

OTHER PUBLICATIONS

International Search Report issued in PCT/JP2015/070686; dated Sep. 8, 2015.

*Primary Examiner* — Shahed Ahmed
(74) *Attorney, Agent, or Firm* — Studebaker & Brackett PC (57) ABSTRACT

A multi-finger transistor includes a circuit suppressing a variation in voltage current distribution. The circuit connects gate fingers (21) to each other, or source fingers (31) to each other in a region which is located outside an active region (11) and on a side where a drain pad (42) is disposed. The multi-finger transistor is configured to be linearly symmetric with respect to a direction of propagation of a signal from a gate pad (22) at the position of the gate pad (22).

2 Claims, 9 Drawing Sheets

(51) Int. Cl.
*H01L 27/04* (2006.01)
*H01L 27/07* (2006.01)
*H01L 29/417* (2006.01)

(52) U.S. Cl.
CPC .......... *H01L 27/04* (2013.01); *H01L 27/0727* (2013.01); *H01L 29/41758* (2013.01)

(58) Field of Classification Search
CPC ........... H01L 29/41758; H01L 23/4951; H01L 51/445
USPC .......................... 257/194, 401; 438/167, 172
See application file for complete search history.

(56) References Cited

U.S. PATENT DOCUMENTS

| | | |
|---|---|---|
| 2004/0188758 A1 | 9/2004 | Inoue et al. |
| 2007/0164283 A1* | 7/2007 | Wachi ............... G02F 1/133553 257/59 |
| 2010/0140721 A1* | 6/2010 | Takagi ................... H01L 23/66 257/401 |
| 2011/0284928 A1 | 11/2011 | Shibata et al. |
| 2012/0012908 A1 | 1/2012 | Matsunaga |
| 2013/0109168 A1* | 5/2013 | Kajii ................. H01L 21/28264 438/605 |

FOREIGN PATENT DOCUMENTS

| | | |
|---|---|---|
| JP | 2001-284992 A | 10/2001 |
| JP | 2001-358543 A | 12/2001 |
| JP | 3499103 B2 | 2/2004 |
| JP | 2004-296983 A | 10/2004 |
| JP | 2007-027317 A | 2/2007 |
| JP | 2010-186925 A | 8/2010 |
| JP | 2014-022417 A | 2/2014 |
| WO | 2010/113779 A1 | 10/2010 |

* cited by examiner

MULTI-FINGER TRANSISTOR AND SEMICONDUCTOR DEVICE

TECHNICAL FIELD

The present invention relates to a multi-finger transistor including a plurality of fingers, and a semiconductor device using the multi-finger transistor.

BACKGROUND ART

Conventionally, a multi-finger transistor including a plurality of fingers is often used in a semiconductor device in a microwave band.

Each cell of a multi-finger transistor has a size of 1 square millimeter or less, and this size is not neglectable for electromagnetic waves having a frequency of several tens of GHz. Therefore, it is necessary to take into consideration a voltage current distribution in each cell. When a variation in the voltage current distribution becomes significant level, a loop oscillation easily occurs.

In order to suppress the occurrence of the loop oscillation in each cell of a multi-finger transistor, one of the center positions (power supply positions) at which the gate fingers, the drain fingers, or the source fingers are bundled together, respectively, is configured so as to be shifted to the others (for example, refer to Patent Literature 1).

CITATION LIST

Patent Literature

Patent Literature 1: Japanese Unexamined Patent Application Publication No. 2014-22417

SUMMARY OF INVENTION

Technical Problem

However, a problem with the conventional configuration disclosed by Patent Literature 1 is that a multi-finger transistor is not symmetric in shape within each cell, and unequal power dividing and combining are carried out between multi-finger transistors. Further, in a case in which many cells are disposed in parallel (namely, in a case of multi-cell), because the shapes of the cells at both ends differ from other cells, unequal power dividing and combining are carried out also at the both ends. Because of the unequal power dividing and combining, some fingers of the multi-finger transistor do not operate desirably, and the performance of the semiconductor device deteriorates.

For example, in a case in which the semiconductor device is used as an amplifier, the gain, the output power and the efficiency decrease. Further, in a case in which the semiconductor device is used as an oscillator, the output power and the efficiency decrease. Moreover, in a case in which the semiconductor device is used as a mixer, the conversion gain, the output power and the efficiency decrease.

The present invention is made in order to solve the above-mentioned problems, and it is therefore an object of the present invention to provide a multi-finger transistor and a semiconductor device that have a symmetric shape within each cell, and can suppress the occurrence of a loop oscillation within each cell.

Solution to Problem

According to the present invention, a multi-finger transistor includes a plurality of gate fingers arranged in an active region on a semiconductor substrate, a plurality of source fingers and a plurality of drain fingers which are alternately arranged in the active region in such a way as to sandwich the gate fingers therebetween, respectively, a gate pad disposed outside the active region, the gate fingers being connected to the gate pad via a gate bus, a source pad disposed in a region which is located outside the active region and on a side where the gate pad is disposed with respect to the active region, the source fingers being connected to the source pad, a drain pad disposed in a region which is located outside the active region and which is located at an opposite side of the gate pad across the active region, the drain fingers being connected to the drain pad, and a source via grounding the source pad. The multi-finger transistor further includes a circuit suppressing a variation in voltage current distribution, connecting the gate fingers to each other or the source fingers to each other in a region which is located outside the active region and on a side where the drain pad is disposed. The multi-finger transistor is configured so as to be linearly symmetric with respect to a direction of propagation of a signal from the gate pad at a position of the gate pad. The circuit suppressing the variation in voltage current distribution is diodes connecting the gate fingers.

Advantageous Effects of Invention

According to the configuration of the present invention as described above, the multi-finger transistor has a symmetric shape within each cell, and can suppress the occurrence of a loop oscillation within the cell.

DESCRIPTION OF EMBODIMENTS

Hereafter, in order to explain this invention in detail, some embodiments of the present invention will be described with reference to the accompanying drawings.

Embodiment 1

Figure 1:
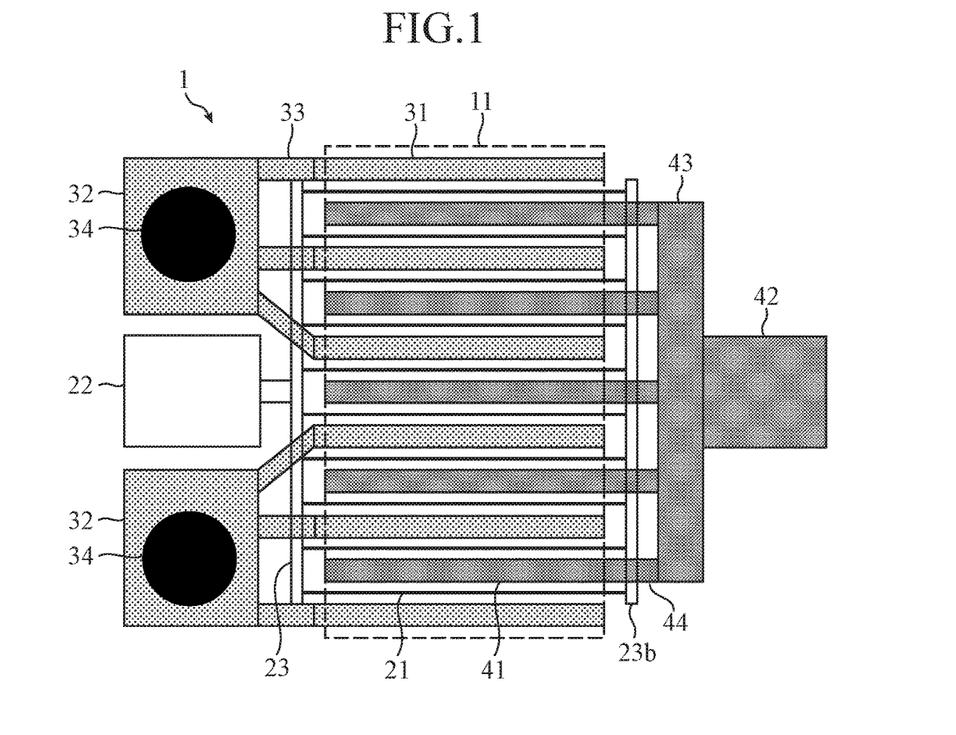
FIG. 1 is a plane view showing an example of a pattern configuration of a multi-finger transistor according to Embodiment 1 of the present invention.

FIG. 1 is a plane view showing an example of the pattern configuration of a multi-finger transistor according to Embodiment 1 of the present invention. In FIG. 1, one cell of the multi-finger transistor is shown.

As shown in FIG. 1, in a multi-finger transistor, a plurality of source fingers 31 and a plurality of drain fingers 41 are alternately disposed in such a way as to sandwich a plurality of gate fingers 21 therebetween, respectively, in an active region 11 formed in a semiconductor substrate 1. This multi-finger transistor is used in a semiconductor device. This semiconductor device is a semi-conductor element which is a transistor or a functional circuit using a transistor. An amplifier, an oscillator or a mixer is an example of such a functional circuit using a transistor.

Further, outside the active region 11 on the semiconductor substrate 1, a gate pad 22 to which the gate fingers 21 disposed in parallel are connected, source pads 32 to which the source fingers 31 disposed in parallel are connected, a drain pad 42 to which the drain fingers 41 disposed in parallel are connected are provided, so that the multi-finger transistor has a configuration which makes it easy to connect to other circuits.

The source pads 32 are disposed in a region on the same side of the multi-finger transistor as that in which the gate pad 22 is disposed, with respect to the active region 11. Further, the drain pad 42 is disposed in a region at the opposite side of the region in which the gate pad 22 is disposed, across the active region 11. Namely, in the example of FIG. 1, the gate pad 22 and the source pads 32 are disposed in the left region of the active region 11, and the drain pad 42 is disposed in the right region of the active region 11.

In a region outside the active region 11 (in the example of FIG. 1, in the left-hand side region), the gate fingers 21 disposed in parallel are bundled together by a gate bus 23 which is an interconnection, and connected to the gate pad 22. Further, in a region outside the active region 11 (in the example of FIG. 1, in a right-hand side region), the drain fingers 41 disposed in parallel are bundled together by a drain bus 43 which is an interconnection, and connected to the drain pad 42. The source fingers 31 are connected to the source pads 32 via source air bridges 33. These source air bridges 33 make it possible to prevent the source fingers from being in contact with the gate bus 23. Further, the source pads 32 are grounded via source vias 34.

In addition, in Embodiment 1, the gate fingers 21 disposed in parallel are also bundled together and connected by a gate bus (second gate bus) 23b which is an interconnection, in the region which is located outside the active region 11 and on the side where the drain pad 42 is disposed with respect to the active region 11 (in the example of FIG. 1, in the right-hand side region). In order to prevent the drain fingers 41 from being in contact with the gate bus 23b, the drain fingers 41 are connected to the drain bus 43 via drain air bridges 44.

The multi-finger transistor is configured so as to be line-symmetric with respect to a direction of propagation of a signal from the gate pad 22 at the position of the gate pad 22. Namely, the multi-finger transistor is configured so as to have a shape symmetric within the cell.

Typically, multi-finger transistors are often used for semiconductor devices for processing signals in a microwave band. On the other hand, each cell of a multi-finger transistor has a size of 1 square millimeter or less, and this size is not neglectable for electromagnetic waves having a frequency of several tens of GHz. Therefore, it is necessary to take a voltage current distribution in each cell into consideration. In particular, because the parasitic capacitance is largest in the gate fingers 21, attention must be given to the voltage current distribution in each of the gate fingers 21 or between the gate fingers 21. When a variation in this voltage current distribution becomes large, a loop oscillation easily occurs.

In conventional configurations, the gate fingers are bundled together and connected by the gate bus only in a region on the side where the source pad is disposed with respect to the active region. Therefore, because in a region on the side where the drain pad is disposed, the voltages at the open ends of the gate fingers differ from one another, so that the multi-finger transistor is in a state in which a loop oscillation easily occurs.

In contrast with this, in the configuration according to Embodiment 1, the gate fingers 21 are bundled together by the gate buses 23 and 23b located on both sides of the active region 11, respectively. Namely, because the open ends of the gate fingers, each of which is a point having a large variation in the voltage distribution in conventional configurations, are bundled together and connected by the gate bus 23b, the electric potentials of the above-mentioned open ends of the gate fingers 21 are equalized, and therefore, the variation in the voltage distribution is hard to occur. As a result, it is possible to suppress a loop oscillation.

Viewing from a different angle, because the gate buses 23 and 23b are interconnections, each of the gate buses contains an inductor component which is not neglectable. The inductor components of these gate buses 23 and 23b cause a variation in voltage current distribution to occur between the gate fingers 21. In such a configuration, by disposing these gate buses 23 and 23b on both sides of the active region 11, the gate buses 23 and 23b can be connected in parallel, and the inductance can be reduced by one-half. As a result, the variation in voltage current distribution in the multi-finger transistor can be reduced, and a loop oscillation can be suppressed.

Figure 2:
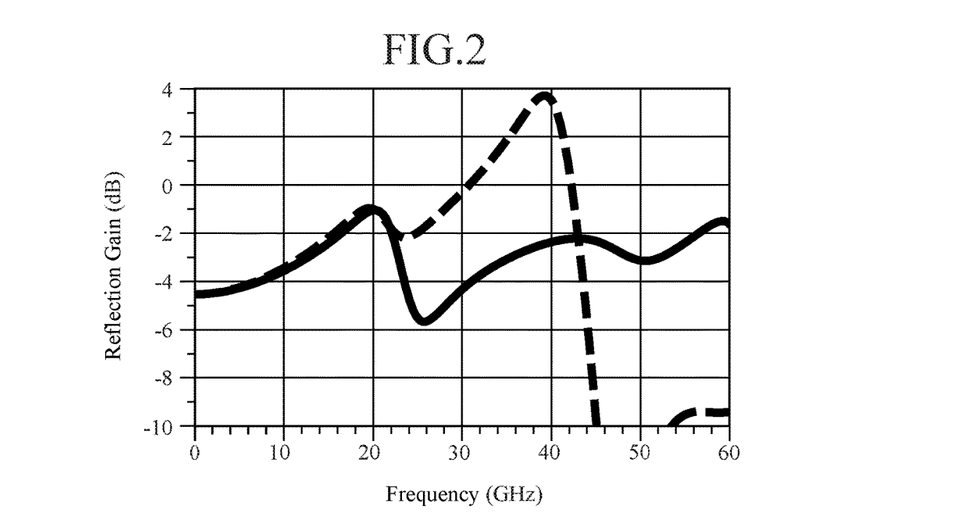
FIG. 2 is a diagram showing an effect of suppressing a loop oscillation which is provided by the multi-finger transistor according to Embodiment 1 of the present invention.

Further, according to the present invention, the shape within a cell is symmetric, and unequal power dividing and combining are not generated between multi-finger transistors, unlike in the case of the conventional configuration disclosed by Patent Literature 1. Therefore, although the multi-finger transistor is applied to the semiconductor device, the performance does not get worse FIG. 2 is a diagram showing an effect of suppressing a loop oscillation in the multi-finger transistor according to Embodiment 1. In FIG. 2, an analysis result which is acquired by performing a simulation of the reflection gain at a source terminal is shown, in which a broken line shows an analysis result in the case of a conventional configuration and a solid line shows an analysis result in the case of the configuration according to Embodiment 1. It is desirable that the reflection gain is as low as possible and has a range as narrow as possible at all of the three terminals of the multi-finger transistor: the gate, drain and source terminals.

As shown in this FIG. 2, in the case of a conventional configuration, the operation becomes nonuniform due to a loop oscillation occurring within the cell, and a reflection gain of a little less than 4 dB occurs in a frequency range of 30 to 40 GHz. In contrast with this, in the configuration according to Embodiment 1, the multi-finger transistor has characteristics which are different from those in the case of the conventional configuration in the frequency range of 20 GHz or more, the reflection gain does not exceed 0 dB, and it is understood that the multi-finger transistor operates stably.

As explained above, because the multi-finger transistor according to this Embodiment 1 is configured in such a way that the gate bus 23b for bundling the gate fingers 21 together and connecting the gate fingers is disposed in a region which is located outside the active region 11 and on the side where the drain pad 42 is disposed, and the multi-finger transistor is linearly symmetric with respect to a direction of propagation of a signal from the gate pad 22 at the position of the gate pad 22, the multi-finger transistor has a symmetric shape within each cell, and it is possible to suppress a loop oscillation within the cell.

Embodiment 2

Figure 3:
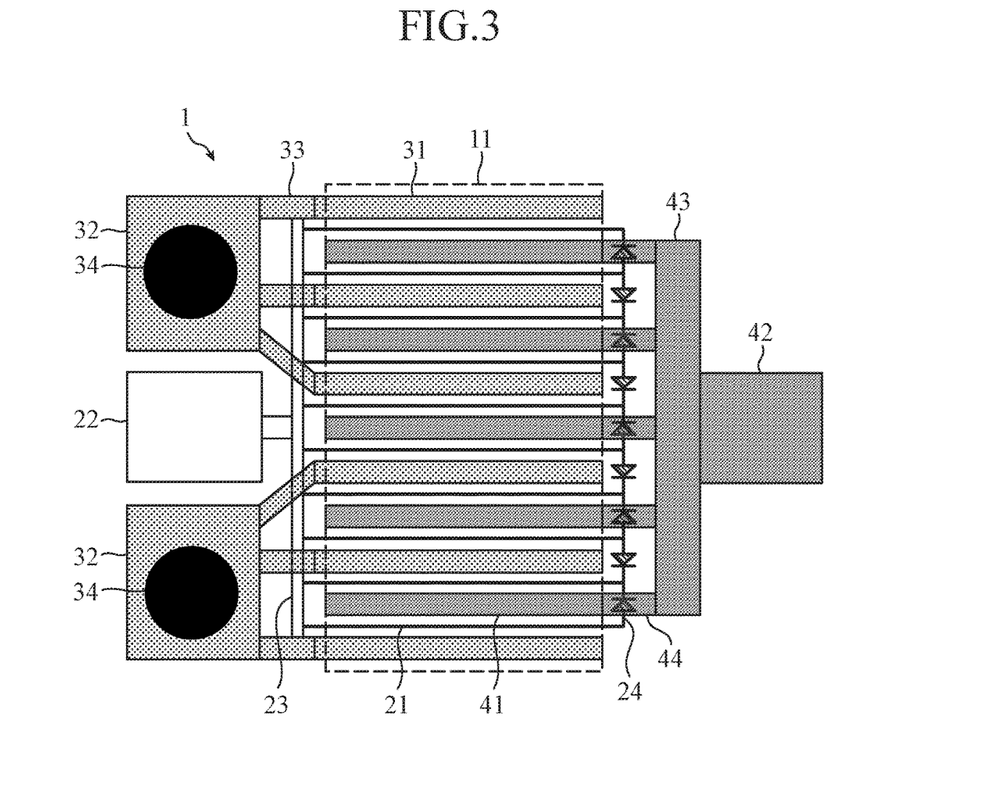
FIG. 3 is a plane view showing an example of a pattern configuration of a multi-finger transistor according to Embodiment 2 of the present invention.

FIG. 3 is a plane view showing an example of the pattern configuration of a multi-finger transistor according to Embodiment 2 of the present invention. In this FIG. 3, one cell of a multi-finger transistor is shown. In the multi-finger transistor according to Embodiment 2 shown in this FIG. 3, the gate bus 23b of the multi-finger transistor according to Embodiment 1 shown in FIG. 1 is changed to diodes 24. The other components are the same as those according to Embodiment 1, and are denoted by the same reference numerals and the explanation of the components will be omitted hereafter.

In Embodiment 1, the configuration in which the gate fingers 21 disposed in parallel are bundled together and connected by the gate buses 23 and 23b on both sides of the active region 11 is shown. With this configuration, the inductor component can be reduced by one-half by using the effect of the parallel connection of inductors.

In contrast with this, in Embodiment 2, gate fingers 21 disposed in parallel are bundled together and connected by the diodes 24, instead of the gate bus 23b, in a region which is located outside an active region 11 and on the side where a drain pad 42 is disposed (in the example of FIG. 1, in a right-hand side region) with respect to the active region 11. The plurality of diodes 24 are connected in series in such a way that the diodes are alternately directed in forward and reverse directions. Further, the connection implemented by the diodes 24 can be formed through the same process as that performed when mounting the multi-finger transistor.

Also with the parallel connection of the inductor of the gate bus 23 and the diodes 24, the impedance can be lowered due to the resistive components of the diodes 24. As a result, a variation in the voltage current distribution in the multi-finger transistor can be reduced, and the occurrence of a loop oscillation can be suppressed.

Embodiment 3

Figure 4:
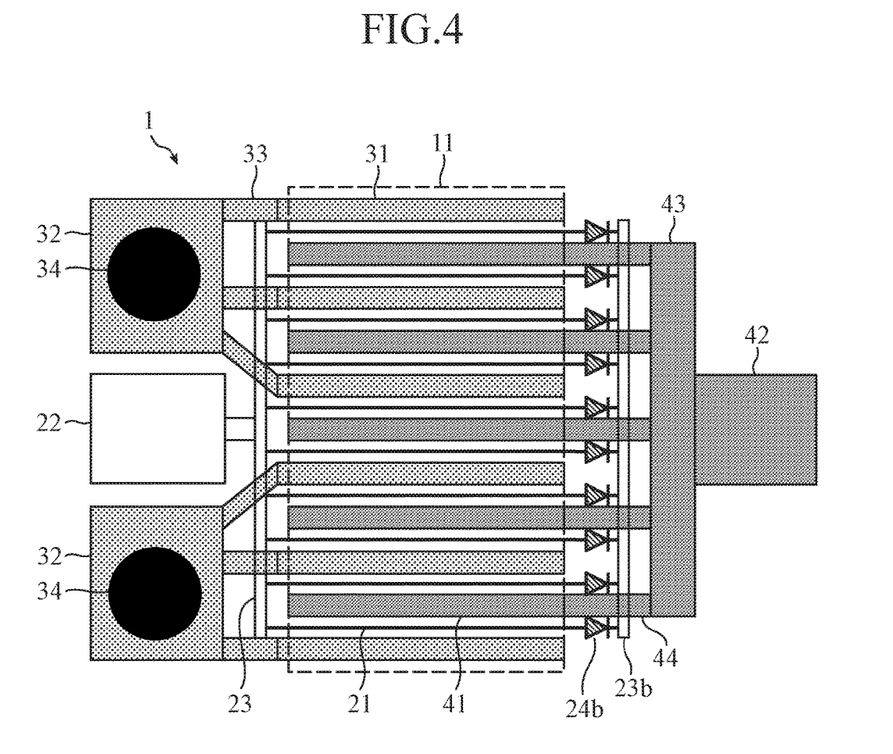
FIG. 4 is a plane view showing an example of a pattern configuration of a multi-finger transistor according to Embodiment 3 of the present invention.

FIG. 4 is a plane view showing an example of the pattern configuration of a multi-finger transistor according to Embodiment 3 of the present invention. In this FIG. 4, one cell of a multi-finger transistor is shown. In the multi-finger transistor according to Embodiment 3 shown in this FIG. 4, diodes (second diodes) 24b are added to the multi-finger transistor according to Embodiment 1 shown in FIG. 1. The other components are the same as those according to Embodiment 1, and are denoted by the same reference numerals and the explanation of the components will be omitted hereafter.

In Embodiment 1, the configuration in which the gate fingers 21 disposed in parallel are bundled together by the gate buses 23 and 23b on both sides of the active region 11 to sandwich the active region 11 is shown. However, in the configuration according to Embodiment 1, the capacitance which is parasitic between the gate bus 23b disposed on the same region as that in which the drain pad 42 is disposed and each drain air bridge 44 increases the amount of feedback between the drain air bridge 44 and the gate fingers 21, and deteriorates the stability of the operation at a low frequency.

To solve this problem, in Embodiment 3, gate fingers 21 disposed in parallel and a gate bus 23b are connected to each other via the diodes 24b. The diodes 24b are connected so as to be directed in a forward direction with respect to a direction of propagation of a signal (a direction extending from a gate pad 22 to a drain pad 42). The connection implemented by the diodes 24b can be formed through the same process as that performed when mounting the multi-finger transistor.

As a result, the amount of feedback between drain air bridges 44 and gate fingers 21 due to the above-mentioned capacitances can be attenuated by the resistive components of the above-mentioned diodes 24. As a result, the stability of the operation at a low frequency can be improved.

Embodiment 4

Figure 5:
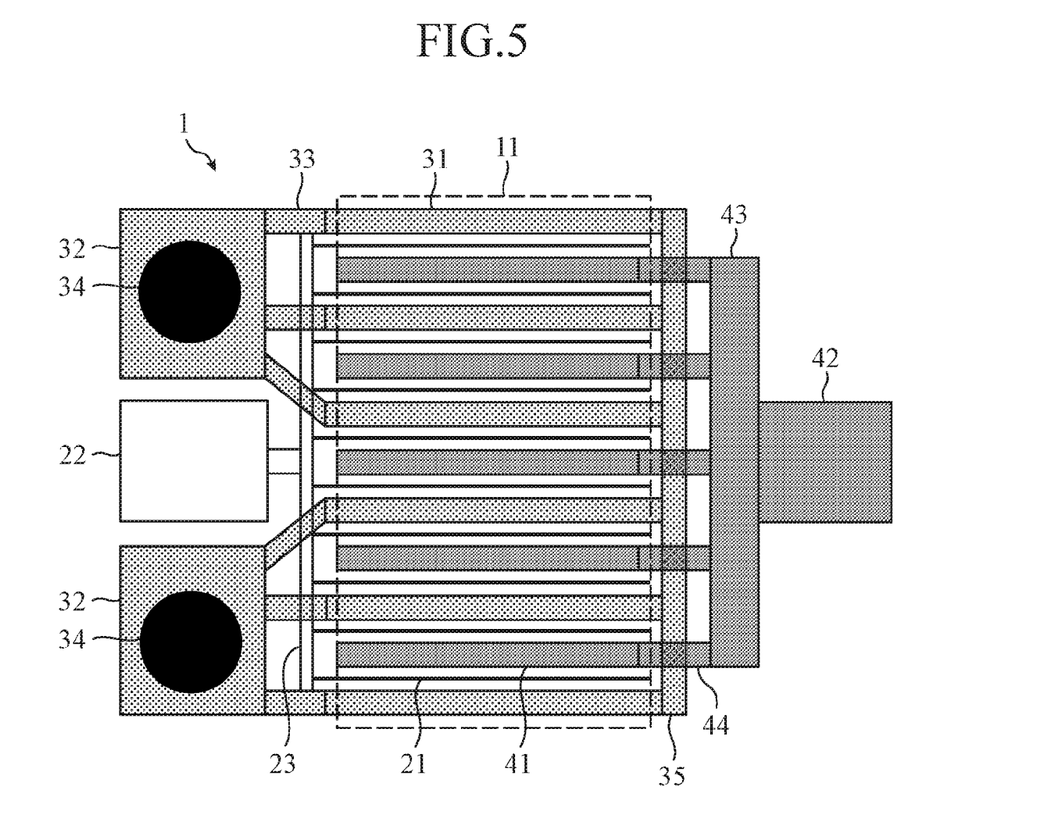
FIG. 5 is a plane view showing an example of a pattern configuration of a multi-finger transistor according to Embodiment 4 of the present invention.

FIG. 5 is a plane view showing an example of the pattern configuration of a multi-finger transistor according to Embodiment 4 of the present invention. In this FIG. 5, one cell of a multi-finger transistor is shown. In the multi-finger transistor according to Embodiment 4 shown in this FIG. 5, the gate bus 23b is removed from the multi-finger transistor according to Embodiment 1 shown in FIG. 1 and a source bus 35 is added instead. The other components are the same as those according to Embodiment 1, and are denoted by the same reference numerals and the explanation of the components will be omitted hereafter.

In Embodiment 1, the configuration in which the gate fingers 21 disposed in parallel are bundled together and connected by the gate buses 23 and 23b on both sides of the active region 11 is shown. On the other hand, a variation in voltage current distribution occurs also between the source fingers 31 although only slightly, and, when this variation in distribution becomes large, a loop oscillation easily occurs.

To solve this problem, in Embodiment 4, source fingers 31 disposed in parallel are bundled together and connected by the source bus 35 which is an interconnection, in a region which is located outside an active region 11 and on the side where a drain pad 42 is disposed (in the example of FIG. 5, in a right-hand side region), with respect to the active region 11. In order to prevent drain fingers 41 from being in contact with the source bus 35, the drain fingers 41 and the drain pad 42 are connected to each other via drain air bridges 44. As a result, on the basis of the same principle as that shown in Embodiment 1, a variation in voltage current distribution occurring between the source fingers 31 can be reduced, and the occurrence of a loop oscillation can be suppressed.

Embodiment 5

Figure 6:
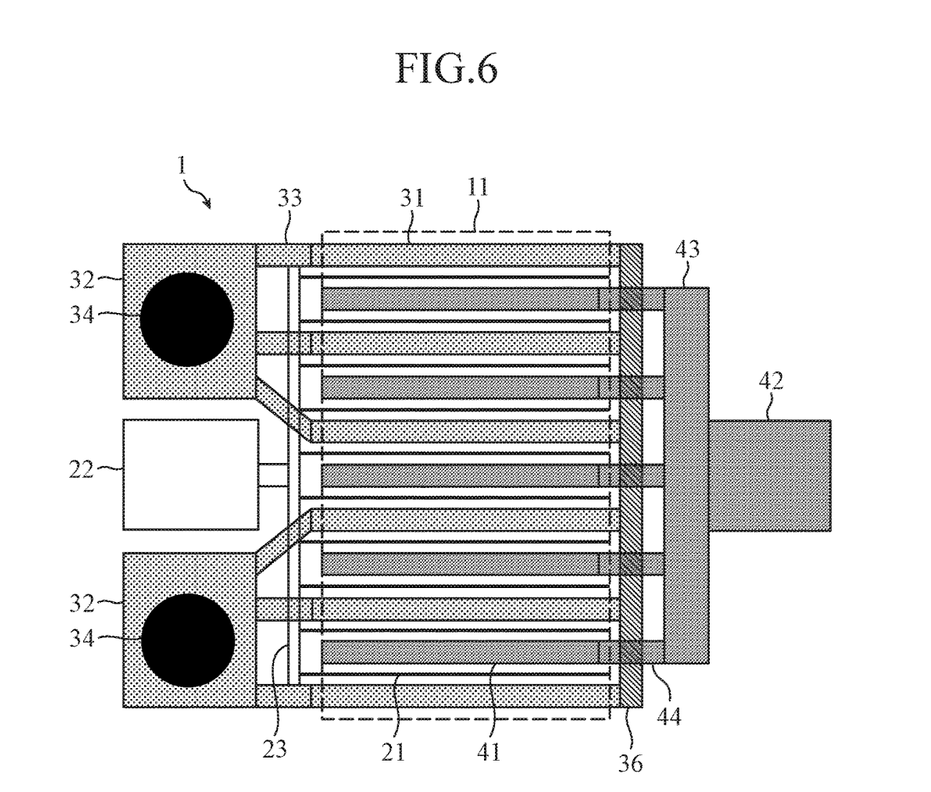
FIG. 6 is a plane view showing an example of a pattern configuration of a multi-finger transistor according to Embodiment 5 of the present invention.

FIG. 6 is a plane view showing an example of the pattern configuration of a multi-finger transistor according to Embodiment 5 of the present invention. In this FIG. 6, one cell of a multi-finger transistor is shown. In the multi-finger transistor according to Embodiment 5 shown in this FIG. 6, the source bus 35 of the multi-finger transistor according to Embodiment 4 shown in FIG. 5 is changed to a resistive line (resistive member) 36. The other components are the same as those according to Embodiment 4, and are denoted by the same reference numerals and the explanation of the components will be omitted hereafter.

In Embodiment 4, the configuration in which the source fingers 31 disposed in parallel are bundled together and connected by the source bus 35, in a region which is located outside the active region 11 and on the side where the drain pad 42 is disposed is shown. However, in the configuration according to Embodiment 4, because the source bus 35 is an interconnection and therefore has an inductor component. Then, there is a case in which this inductor component brings an adverse effect, and as a result, the variation in voltage current distribution between the source fingers 31 cannot be reduced as expected.

To solve this problem, in Embodiment 5, source fingers 31 disposed in parallel are bundled together and connected by the resistive line 36 which is a resistive film having resistance characteristics, instead of the source bus 35, in a region which is located outside the active region 11 and on the side where a drain pad 42 is disposed, with respect to the active region 11. As a result, the variation in voltage current distribution between the source fingers 31 can be reduced.

Embodiment 6

The configurations shown in Embodiments 1 to 5 are aimed at reducing the variation in voltage current distribution occurring between the gate fingers 21 or between the source fingers 31. In contrast with this, Embodiment 6 is aimed at reducing the variation in voltage current distribution in each source finger 31.

Figure 7:
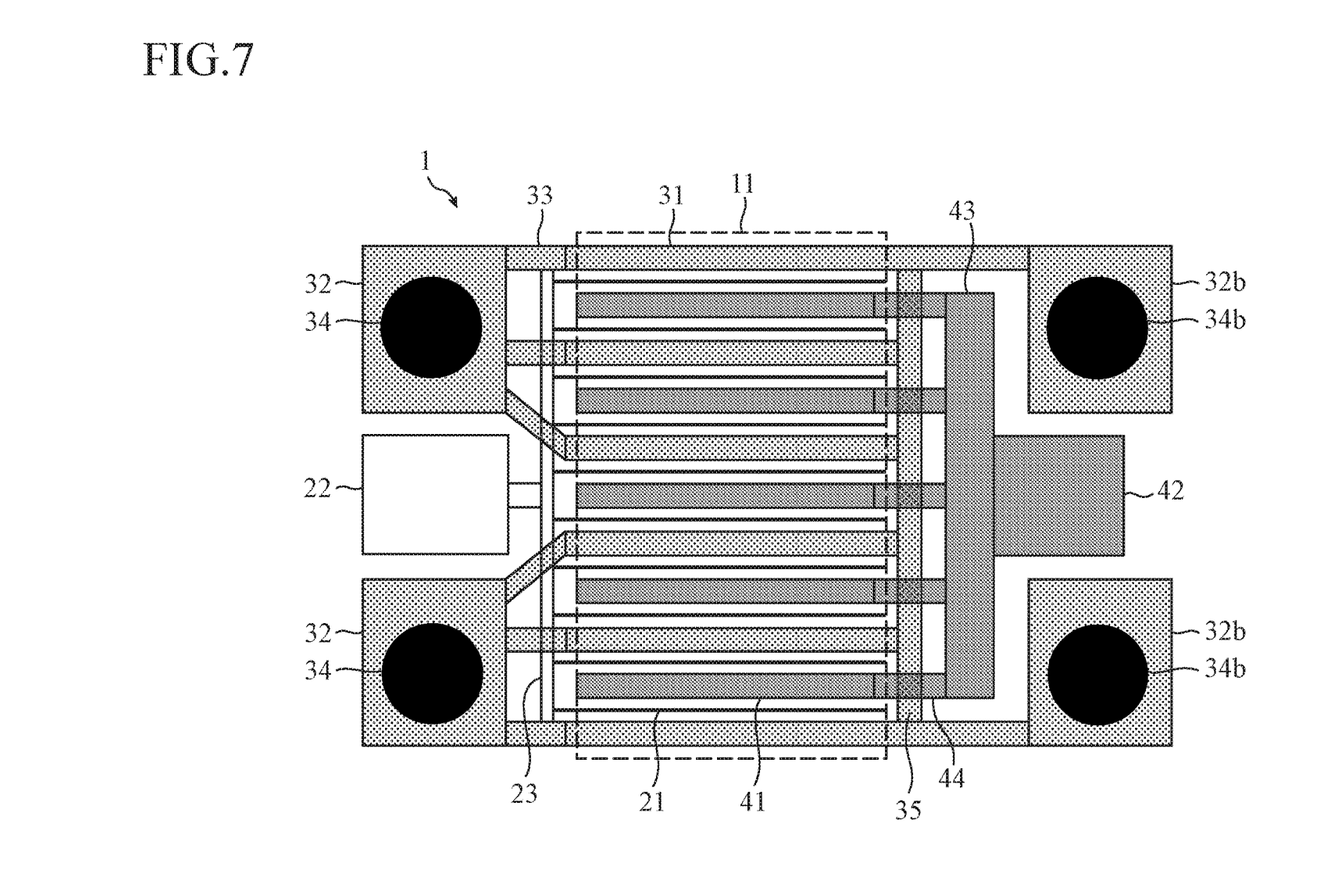
FIG. 7 is a plane view showing an example of a pattern configuration of a multi-finger transistor according to Embodiment 6 of the present invention.

FIG. 7 is a plane view showing an example of the pattern configuration of a multi-finger transistor according to Embodiment 6 of the present invention. In this FIG. 7, one cell of a multi-finger transistor is shown. In the multi-finger transistor according to Embodiment 6 shown in this FIG. 7, source pads (second source pads) 32b and source vias (second source vias) 34b are added to the multi-finger transistor according to Embodiment 4 shown in FIG. 5. The other components are the same as those according to Embodiment 4, and are denoted by the same reference numerals and the explanation of the components will be omitted hereafter.

In applications to high frequency amplifiers, a configuration of grounding a source terminal of a transistor is adopted in many cases. In Embodiments 1 to 5, the source terminals are grounded via the source vias 34 disposed in a region which is located outside the active region 11 and on the side where the gate pad 22 is disposed. However, each of the source fingers 31 includes an inductor component. Therefore, the grounding effect decreases with distance from the source vias 34. Namely, in the configurations shown in Embodiments 1 to 5, the ends of the source fingers 31, the ends being located in a region located across the active region 11 from the region in which the source vias 34 are disposed, are in a state in which the ends are kept at an electric potential different from the ground potential.

To solve this problem, in Embodiment 6, the source pads 32b are disposed also in a region which is located outside an active region 11 and in the side where a drain pad 42 is disposed, and a source bus 35 is connected thereto. In the example of FIG. 7, two source fingers 31 at both side ends of the multi-finger transistor are extended so as to be connected to the source pads 32b. Further, the source vias 34b are disposed in the source pads 32b, respectively, so that the source pads are grounded. As a result, the ends of the source fingers 31 in a region which is located across the active region 11 from that in which a gate pad is disposed and in which the drain pad 42 is disposed become nearly in a state in which the ends are grounded. As a result, the variation in voltage current distribution within each of the source fingers 31 can be reduced, and the occurrence of a loop oscillation can be suppressed.

Figure 8:
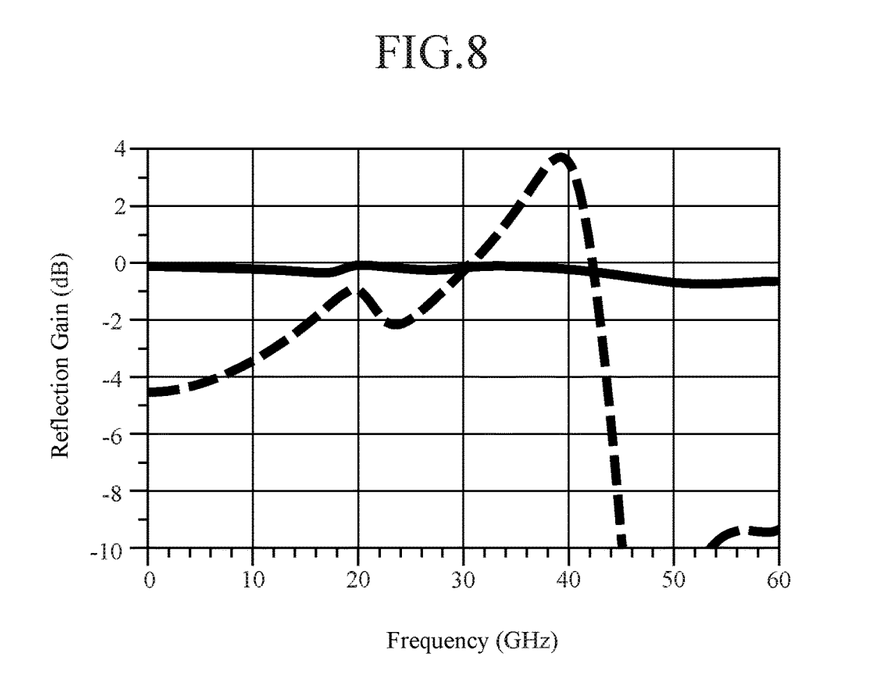
FIG. 8 is a diagram showing an effect of suppressing a loop oscillation which is provided by the multi-finger transistor according to Embodiment 6 of the present invention.

FIG. 8 is a diagram showing an effect of suppressing a loop oscillation which is provided by the multi-finger transistor according to Embodiment 6 of the present invention. In FIG. 8, analysis results which are acquired by performing a simulation of the reflection gain at a source terminal are shown. A broken line shows an analysis result in the case of a conventional configuration and a solid line shows an analysis result in the case of the configuration according to Embodiment 6. It is desirable that the reflection gain is as low as possible and has a range as narrow as possible at all of the three terminals of the multi-finger transistor: the gate, drain and source terminals.

As shown in this FIG. 8, in the case of the conventional configuration, the operation becomes nonuniform due to a loop oscillation occurring within the cell, and a reflection gain of a little less than 4 dB occurs in a frequency range of 30 to 40 GHz. In contrast with this, it is seen from the simulation that, in the configuration according to Embodiment 6, the reflection gain does not exceed 0 dB, and the multi-finger transistor operates stably.

Embodiment 7

Figure 9:
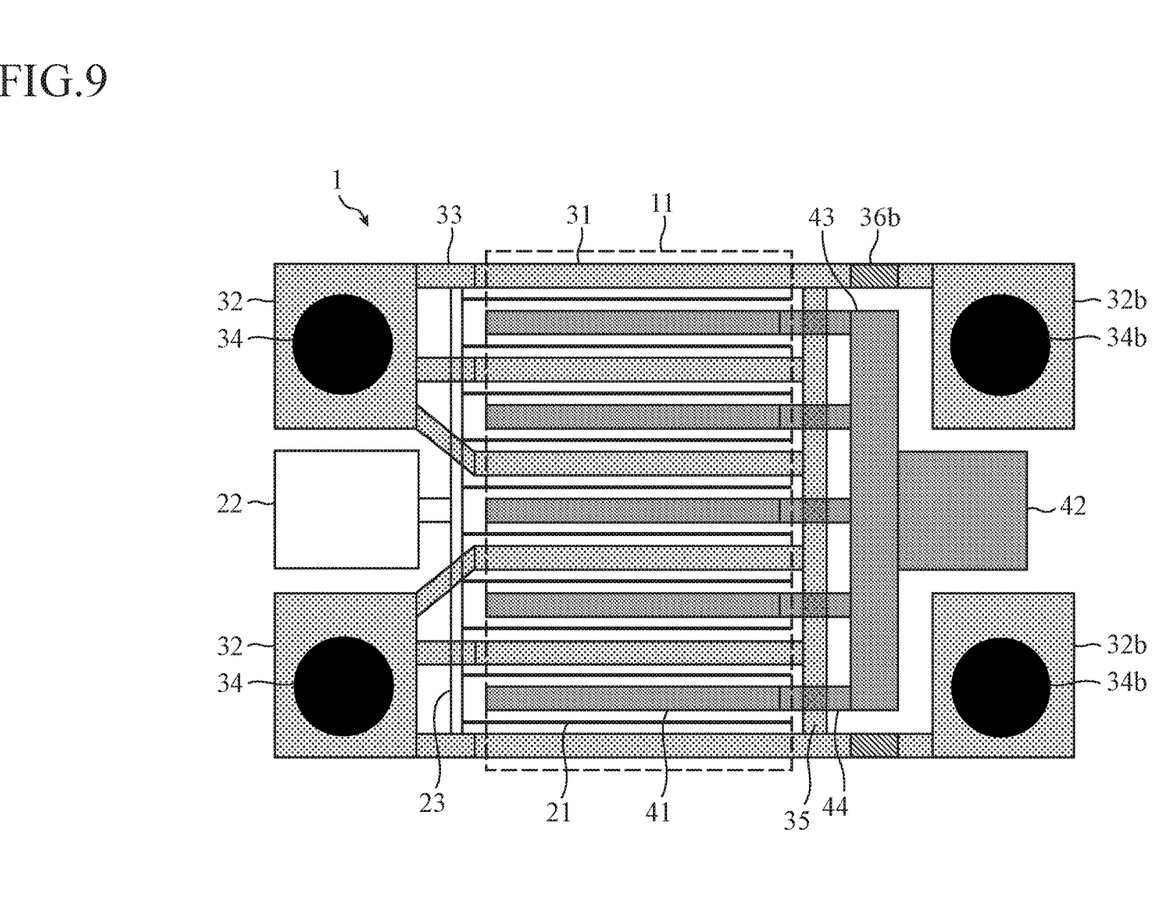
FIG. 9 is a plane view showing an example of a pattern configuration of a multi-finger transistor according to Embodiment 7 of the present invention.

FIG. 9 is a plane view showing an example of the pattern configuration of a multi-finger transistor according to Embodiment 7 of the present invention. In this FIG. 9, one cell of a multi-finger transistor is shown. In the multi-finger transistor according to Embodiment 7 shown in this FIG. 9, resistive lines (second resistive members) 36b are added to the multi-finger transistor according to Embodiment 6 shown in FIG. 7. The other components are the same as those according to Embodiment 6, and are denoted by the same reference numerals and the explanation of the components will be omitted hereafter.

In Embodiment 6, the configuration in which the source bus 35 and the source pads 32b are connected via interconnections is shown.

In contrast with this, in Embodiment 7, a source bus 35 and source pads 32b are connected via the resistive lines 36b which are resistive films having resistive characteristics. As a result, as the load impedance of a source connected to an intrinsic transistor, a parallel circuit in which the inductance of source fingers 31 and the resistive lines 36b are connected in parallel is connected. Here, by referring to the intrinsic transistor, the multi-finger transistor is meant, in which parasitic components (parasitic capacitances of electrodes and parasitic inductances of the electrodes) are excluded, and physically the internal portion (intrinsic portion) of the semiconductor is referred to. With this configuration, at the ends of the source fingers 31 located in the region on the side of the drain pad 42 with respect to the active region 11, the impedance decreases as compared with the case in which no resistive line 36b is disposed, and their potentials get close to ground potential. As a result, the variation in voltage current distribution in each of the source fingers 31 can be reduced, the loop generation can be suppressed, and the stability of the operation can be improved. However, the stability of the operation is not necessarily improved with decrease in the resistance, and it is most desirable that the resistance value is in a range of several Q to several tens Q.

Figure 10:
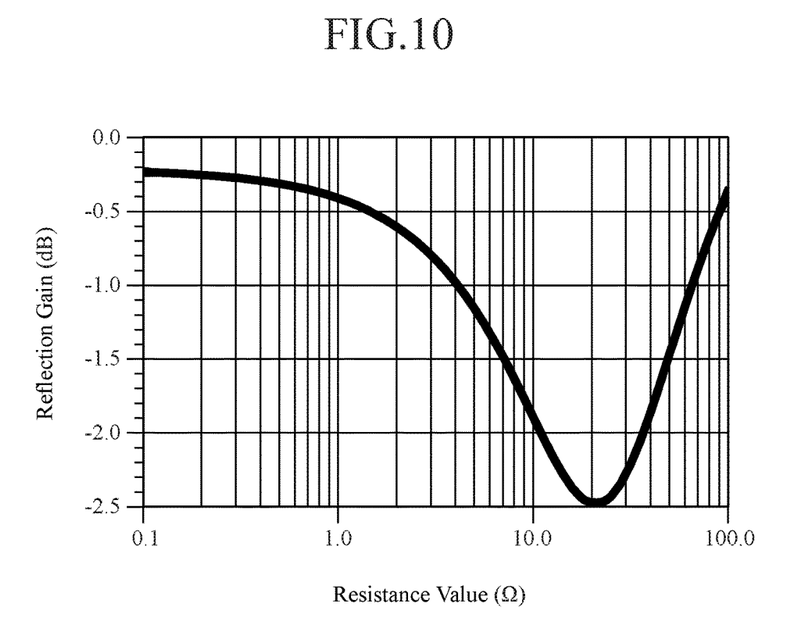
FIG. 10 is a diagram showing an effect of suppressing a loop oscillation in the multi-finger transistor according to Embodiment 7 of the present invention.

FIG. 10 is a diagram showing a relation between the resistance value (per resistor) between the source bus 35 and the source pads 32b, and the reflection gain. The frequency used for analysis is set to 38.2 GHz at which a problem has arisen conventionally.

As shown in FIG. 10, at the limit of the resistance value zero at which the multi-finger transistor is in the same state as that of Embodiment 6, the reflection gain is approximately −0.2 dB. In contrast with this, it is seen from the analysis that when the resistance value is in a range of several Q to several tens Q, the reflection gain can be reduced to less than −1 dB, and high stability is achieved.

While the invention has been described with reference to some embodiments thereof, it is to be understood that any combination of the above-explained embodiments can be made, various changes can be made in any component of any one of the embodiments, and any component of any one of the embodiments can be omitted within the scope of the invention.

INDUSTRIAL APPLICABILITY

Because the multi-finger transistor according to the present invention is configured so as to include a circuit for suppressing a variation in voltage current distribution, the circuit connecting either the gate fingers or the source fingers in a region which is located outside the active region and on the side where the drain pad is disposed, and to be linearly symmetric with respect to a direction of propagation of a signal from the gate pad at the position of the gate pad, the multi-finger transistor has a symmetric shape within the cell, and can suppress the occurrence of a loop oscillation within the cell. Therefore, the multi-finger transistor according to the present invention is suitable for use in a semiconductor device.

REFERENCE SIGNS LIST 1 semiconductor substrate, 11 active region, 21 gate finger, 22 gate pad, 23 gate bus, 23b gate bus (second gate bus), 24 diode, 24b diode (second diode), 31 source finger, 32 source pad, 32b source pad (second source pad), 33 source air bridge, 34 source via, 34b source via (second source via), 35 source bus, 36 resistive line (resistive member), 36b resistive line (second resistive member), 41 drain finger, 42 drain pad, 43 drain bus, and 44 drain air bridge.

The invention claimed is:
1. A multi-finger transistor comprising:
a plurality of gate fingers arranged in an active region on a semiconductor substrate;
a plurality of source fingers and a plurality of drain fingers which are alternately arranged in said active region in such a way as to sandwich said gate fingers therebetween, respectively;
a gate pad disposed outside said active region, said gate fingers being connected to said gate pad via a gate bus;
a source pad disposed in a region which is located outside said active region and on a side where said gate pad is disposed with respect to said active region, said source fingers being connected to said source pad;
a drain pad disposed in a region which is located outside said active region and which is located at an opposite side of said gate pad across said active region, said drain fingers being connected to said drain pad;
and a source via grounding said source pad, wherein
said multi-finger transistor further comprises a circuit suppressing a variation in voltage current distribution, said circuit connecting said gate fingers to each other, or connecting said source fingers to each other with a resistive member having a resistance higher than said source fingers, in a region which is located outside said active region and on a side where said drain pad is disposed, and
said multi-finger transistor is configured so as to be linearly symmetric with respect to a direction of propagation of a signal from said gate pad at a position of said gate pad.
2. A semiconductor device using the multi-finger transistor according to claim 1.

* * * * *